United States Patent
Sakamoto

(10) Patent No.: US 8,219,963 B2
(45) Date of Patent: Jul. 10, 2012

(54) METHOD AND APPARATUS FOR ANALYZING AND DESIGNING SEMICONDUCTOR DEVICE USING CALCULATED SURFACE POTENTIAL

(75) Inventor: Hironori Sakamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 283 days.

(21) Appl. No.: 12/457,374

(22) Filed: Jun. 9, 2009

(65) Prior Publication Data

US 2009/0319966 A1 Dec. 24, 2009

(30) Foreign Application Priority Data

Jun. 18, 2008 (JP) ................... 2008-159701

(51) Int. Cl.
G06F 17/50 (2006.01)
G06F 7/60 (2006.01)
G06F 17/10 (2006.01)
(52) U.S. Cl. ........ 716/136; 716/100; 716/110; 716/113; 716/115; 703/2
(58) Field of Classification Search .................. None
See application file for complete search history.

(56) References Cited

U.S. PATENT DOCUMENTS

| | | | |
|---|---|---|---|
| 4,584,662 A * | 4/1986 | Lin ................... | 703/4 |
| 6,480,986 B1 * | 11/2002 | Richer .............. | 716/115 |
| 7,685,543 B2 * | 3/2010 | Tsuji et al. ........ | 716/106 |
| 7,735,034 B2 * | 6/2010 | Miura et al. ....... | 716/136 |
| 7,890,898 B2 * | 2/2011 | Yoshimoto et al. .... | 716/136 |
| 2009/0132974 A1 * | 5/2009 | Yoshimoto et al. ... | 716/4 |
| 2011/0184708 A1 * | 7/2011 | Miura-Mattausch et al. .... | 703/2 |

OTHER PUBLICATIONS

Yon-Sup Pang et al., Analytical Subthreshold Surface Potential Model for Pocket n-MOSFETs, IEEE Transactions on Electron Devices, vol. 49, No. 12, pp. 2209-2216 (pp. 1-6), Dec. 2002.*
Richard Booth et al., The Effect of Channel Implants on MOS Transistor Characterization, IEEE Transactions on Electron Devices, vol. ED-34, No. 12, pp. 2501-2508, Dec. 1987.*
Mitiko Miura-Mattausch, et al., "Unified Complete MOSFET Model for Analysis of Digital and Analog Circuits," IEEE Transactions on Computer-Aided Design of Integrated Circuits and Systems, vol. 15: Jan. 1, 1996, 7 pages.
Mitiko Miura-Mattausch, et al., "HiSIM2: Advanced MOSFET Model Valid for RF Circuit Simulation," IEEE Transactions on Electron Devices, vol. 53: Sep. 9, 2006, 14 pages.

* cited by examiner

*Primary Examiner* — Leigh Garbowski
*Assistant Examiner* — A. M. Thompson
(74) *Attorney, Agent, or Firm* — Foley & Lardner LLP

(57) ABSTRACT

In a support apparatus for analysis and design of a semiconductor device, a function indicating an impurity concentration distribution in a channel region of a first transistor in a depth direction is set. A structure data indicating a structure of a transistor device and a measurement value of each of electric characteristics of the transistor are related. A Poisson's equation, which is express by using the function, is solved by using a depletion layer width as a variable to calculate a surface potential, and a first calculation value of the electric characteristic of the first transistor is calculated by using the surface potential. A determining section determines the function to indicate the impurity concentration distribution of a first transistor when a measurement value corresponding to a first structure data which indicates a structure of the first transistor, and the first calculation value are substantially coincident with each other.

9 Claims, 6 Drawing Sheets

METHOD AND APPARATUS FOR ANALYZING AND DESIGNING SEMICONDUCTOR DEVICE USING CALCULATED SURFACE POTENTIAL

INCORPORATION BY REFERENCE

This patent application claims priority on convention based on Japanese Patent Application No. 2008-159701. The disclosure thereof is incorporated herein by reference.

BACKGROUND OF THE INVENTION

1. Field of the Invention

The present invention relates to a method for analyzing and designing device a semiconductor device and a support apparatus for the same.

2. Description of the Related Art

A technique for analyzing characteristics of an electronic element such as a transistor has been known in "HiSIM2: Advanced MOSFET Model Valid For RF Circuit Simulation" (IEEE Trans. On Electron Devices, Vol. 53, No. 9, pp. 1994-2007, 2006) by M. Miura-Mattausch et al. In this related art 1, a technique is described for analyzing characteristics of a MOS transistor. FIG. 1 is a sectional view showing the structure of a MOS transistor of such model. A MOS transistor 30 as a model transistor has a source region 35, a drain region 33, a gate oxide film 32, a channel region 34 and a gate electrode 31. The source region 35 and the drain region 33 are provided in a surface region of a semiconductor substrate to put the channel region 34 between them. The gate oxide film 32 and the gate electrode 31 are laminated in this order to cover the channel region 34. According to the technique, channel impurity concentration distribution as concentration distribution of impurities in a depth direction in the channel region 34 is represented to be approximated to a constant value. A surface potential is found by solving Poisson equation in case of constantly approximated channel impurity concentration distribution using the surface potential as a variable. The found surface potential can be used for calculation of electric characteristics of the transistor. Here, the electric characteristics of the transistor are exemplified a gate capacitance $C_{gg}$-gate voltage $V_g$ characteristic and a threshold voltage $V_{th}$-substrate voltage $V_b$ characteristic (or a drain current $I_d$-substrate voltage $V_b$ characteristic). Methods for calculating these transistor characteristics are described in the above-mentioned related art 1 and "Unified complete MOSFET model for analysis of digital and analog circuits" (Proc. IEEE Trans. On Comput.-Aided Des./Int. Conf. Comput. Aided Des., vol. 15, no. 1, pp. 1-7, January 1996) by M. Miura-Mattausch, U. Feldmann, A. Rahm, M. Bollu, and D. Savignac as a related art 2. By using the transistor characteristics obtained according to these methods, analysis of a semiconductor element and design of a semiconductor circuit can be achieved.

As described above, according to the technique described in the above-mentioned related arts, a model in which channel impurity concentration distribution is approximated to a constant value is used. FIG. 2 is a graph showing an example of channel impurity concentration distribution of the MOS transistor in a depth direction. A vertical axis represents impurity concentration and a horizontal axis represents depth. In contrast that concentration is constant in an impurity concentration distribution 101 (solid line) of the above-mentioned model in the depth direction, concentration in an actual impurity concentration distribution 41 (broken line) varies depending on the depth. In other words, the impurity concentration distribution 101 of the model in the above-mentioned related arts is different from the actual impurity concentration distribution 41. For this reason, the transistor characteristics calculated using the surface potential based on the impurity concentration distribution of the model cannot represent actual transistor characteristics with high accuracy. As a result, an error is present in analysis of the semiconductor element and design of the semiconductor circuit.

SUMMARY

In an aspect of the present invention, a support apparatus for analysis and design of a semiconductor device, includes a storage section configured to store a set of a structure data indicating a structure of a transistor device and a measurement value of each of electric characteristics of the transistor. A concentration distribution setting section is configured to set a function indicating an impurity concentration distribution in a channel region of a first transistor in a depth direction. A device property calculating section is configured to express a Poisson's equation by using the function, to solve the expressed Poisson's equation by using a depletion layer width as a variable to calculate a surface potential, and to determine a first calculation value of the electric characteristic of the first transistor by using the surface potential. A determining section is configured to refer to the storage section based on a first structure data indicating a structure of the first transistor to read out a measurement value corresponding to the first structure data, to determine the function to indicate the impurity concentration distribution of the first transistor when the measurement value and the first calculation value are substantially coincident with each other, and to store the function in the storage section in relation to the structure data. The concentration distribution setting section and the device property calculating section perform their operations until the first calculation value and the measurement value are substantially coincident with each other.

In another aspect of the present invention, a method of analyzing and designing a semiconductor device, is achieved by setting a function indicating an impurity concentration distribution in a channel region of a first transistor in a depth direction; by determining a surface potential by solving a Poisson's equation, which is expressed using the function, with respect to a depletion layer width as a variable; by calculating a first calculation value of an electric characteristic of the first transistor; by reading out a measurement value corresponding to a first structure data indicating a structure of the first transistor from a storage section which stores a set of a structure data indicating a structure of a transistor and a measurement value of an electric characteristic of the transistor; by determining the function to indicate the impurity concentration distribution of the first transistor when the measurement value and the first calculation value are coincident with each other; by storing the function in the storage section in relation to the structure data; and by repeating the setting, the determining a surface potential and the calculating a first calculation value until the measurement value and the first calculation value are coincident with each other.

In still another aspect of the present invention, a computer-readable recording medium is provided in which a computer-readable program code is stored to realize a method of analyzing and designing a semiconductor device. The method is achieved by setting a function indicating an impurity concentration distribution in a channel region of a first transistor in a depth direction; by determining a surface potential by solving a Poisson's equation, which is expressed using the function, with respect to a depletion layer width as a variable; by calculating a first calculation value of an electric characteristic of the first transistor; by reading out a measurement value corresponding to a first structure data indicating a structure of the first transistor from a storage section which stores a set of a structure data indicating a structure of a transistor and a measurement value of an electric characteristic of the transistor; by determining the function to indicate the impurity concentration distribution of the first transistor when the measurement value and the first calculation value are coincident with each other; by storing the function in the storage section in relation to the structure data; and by repeating the setting, the determining a surface potential and the calculating a first calculation value until the measurement value and the first calculation value are coincident with each other.

According to the present invention, analysis and design of the semiconductor device can be achieved more accurately.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a method for analyzing and designing a semiconductor device and a support apparatus for the same according to the present invention will be described in detail with reference to the attached drawings.

According to the present invention, a channel impurity concentration distribution N(x) in a depth direction is selected (assumed), and a Poisson equation is represented using the distribution N(x) and solved by using a depletion layer width W as a variable. Thereby, a surface potential $\phi s(W)$ is calculated, and transistor electric characteristics are calculated using the surface potential $\phi s(W)$. When the calculated value of the characteristics corresponds to measured values of the actual transistor characteristics, the distribution N(x) is recognized as the channel impurity concentration distribution. This distribution N(x) can be deemed to be equivalent to an actual channel impurity concentration distribution. Therefore, by applying the distribution N(x) to a transistor model according to a surface potential method, the actual transistor characteristics can be reproduced with high accuracy. Thereby, analysis and design of the semiconductor device (semiconductor element, semiconductor circuit) can be performed with a reduced error. This will be described in detail below.

Figure 3:
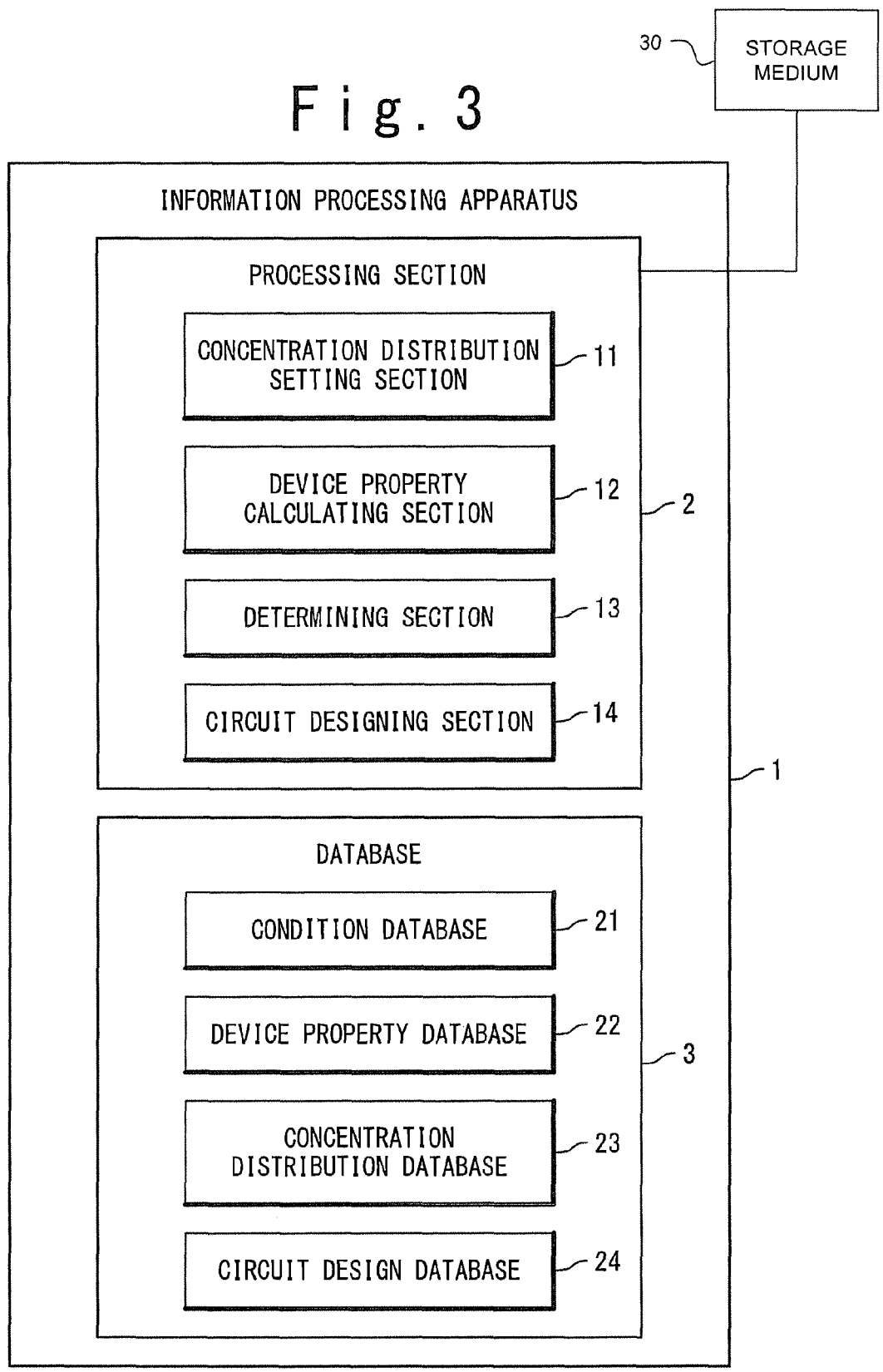
FIG. 3 is a block diagram showing a configuration of an information processing apparatus according to an embodiment of the present invention.

FIG. 3 is a block diagram showing a configuration of an information processing apparatus according to an embodiment of the present invention. This information processing apparatus 1 functions as an apparatus for analysis and design support of a semiconductor device. In other words, the information processing apparatus 1 performs calculation of the channel impurity concentration distribution in a depth direction of the transistor, calculation of a surface potential by using the channel impurity concentration distribution, calculation of the transistor electric characteristics by using of the surface potential and design support of a semiconductor circuit by using the transistor electric characteristics. The information processing apparatus 1 has a processing section 2 and a database 3.

The information processing apparatus 1 is exemplified by a computer. A processing section 2 is a program which is loaded from a computer readable storage medium 30 in a storage device (not shown) and stored therein, and a CPU (not shown) executing the program. The processing section 2 has a concentration distribution setting section 11, a device property calculating section 12, a determining section 13 and a circuit designing section 14.

The concentration distribution setting section 11 performs selection of the channel impurity concentration distribution in the depth direction of the transistor.

The device property calculating section 12 performs calculation of the surface potential by using the channel impurity concentration distribution which is selected by the concentration distribution setting section 11 or stored in a concentration distribution database 23 and calculation of the transistor (electric) characteristics by using the surface potential.

The determining section 13 compares the transistor electric characteristics calculated by the device property calculating section 12 with measured values of the transistor characteristics, which is stored in an device property database 22, and determines whether or not they coincident with each other.

The circuit designing section 14 performs design (logic design and layout design) of the semiconductor circuit using the transistor characteristics calculated by the device property calculating section 12 or the transistor characteristics stored in a circuit design database 24.

The database 3 is data and a program which are stored in a storage device (not shown) and read or written by a CPU (not shown). The database 3 has a condition database 21, a device property database 22, a concentration distribution database 23 and a circuit design database 24. However, the database 3 may be provided outside of the information processing apparatus 1 so as to bidirectionally communicate with each other. Each database in the database 3 may be an integrated or separated body.

The condition database 21 associates data on a transistor manufacturing condition (including size) with data on a transistor operational condition and stores the associated data therein. Here, the data on the transistor operational condition is exemplified by a substrate voltage $V_b$, a gate voltage $V_g$ and an operational temperature T. The data on the transistor manufacturing conditions is exemplified by data on a manufacturing method such as manufacturing conditions (ion implantation condition, diffusion condition) of diffusion layers (source region/drain region) and data on a transistor structure such as a transistor size (gate length $L_g$, gate width $w_g$, oxide film thickness $T_{ox}$). As described above, since the data on the transistor manufacturing condition (including size) can be deemed to identify the transistor structure, the data can be recognized as data specifying the structure (structure data).

The device property database 22 associates the data on the transistor manufacturing condition (including size), the data on the transistor operational condition and data on measured values of the transistor characteristics with one another and stores the associated data therein. Here, the data on the measured values of the transistor characteristics is exemplified by a gate capacitance $C_{gg}$-gate voltage $V_g$ characteristic and a threshold voltage $V_{th}$-substrate voltage $V_b$ characteristic (or a drain current $I_d$-substrate voltage $V_b$ characteristic) which are measured at an actual transistor.

The concentration distribution database 23 associates a function showing the channel impurity concentration distribution which is calculated by the concentration distribution setting section 11 and determined by the determining section 14, with the data on the transistor manufacturing condition (including size) and stores the associated data therein.

The circuit design database 24 associates data on the transistor characteristics calculated by the device property calculating section 12, with data on the transistor manufacturing condition (including size) and stores the associated data therein. The data may be stored as a part of a cell/block library relating to a basic logic gate, a logic circuit block and a cell, for example. The circuit design database 24 further stores data necessary for circuit design.

Next, a method of analyzing the semiconductor device (including calculation of the channel impurity concentration distribution) will be described.

Figure 4:
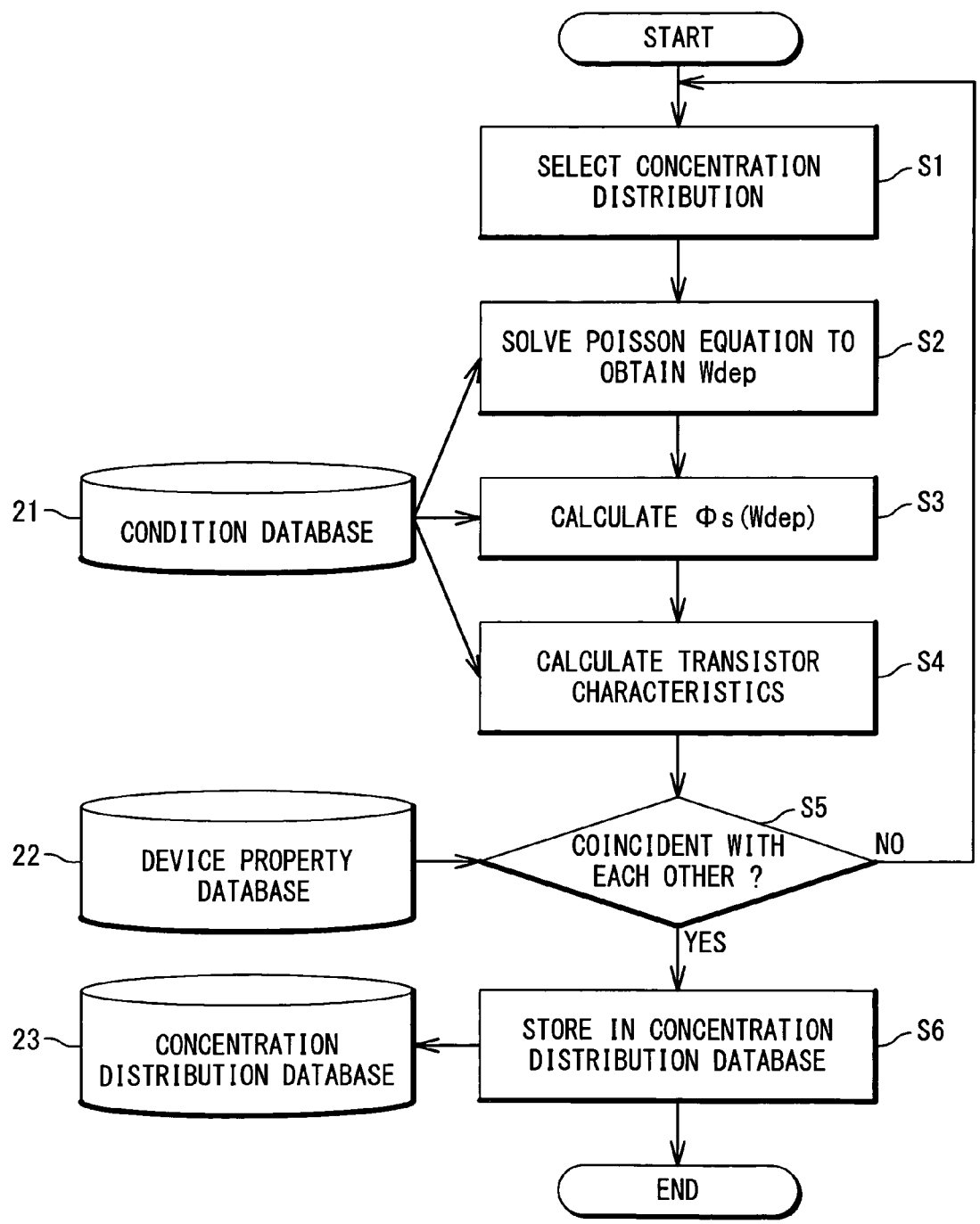
FIG. 4 is a flow chart showing an operation of the information processing apparatus according to the embodiment of the present invention.

FIG. 4 is a flow chart showing an operation of the data processing apparatus according to the embodiment of the present invention. The operation of the data processing apparatus 1 functions as the method of analyzing the semiconductor device.

Figure 1:
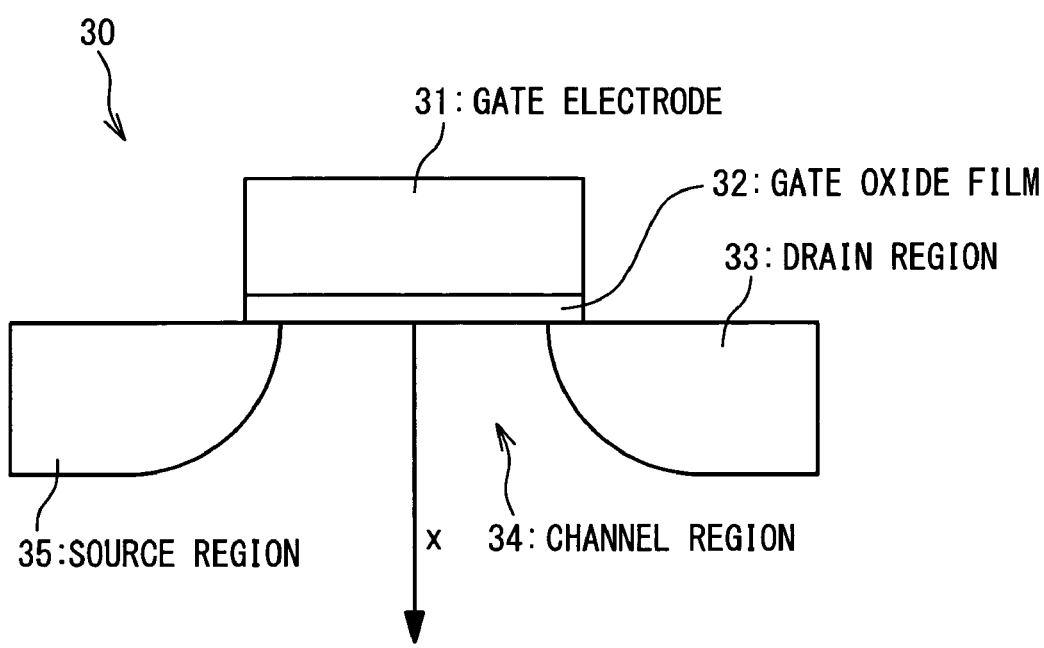
FIG. 1 is a sectional view showing a configuration of a MOS transistor.
Figure 2:
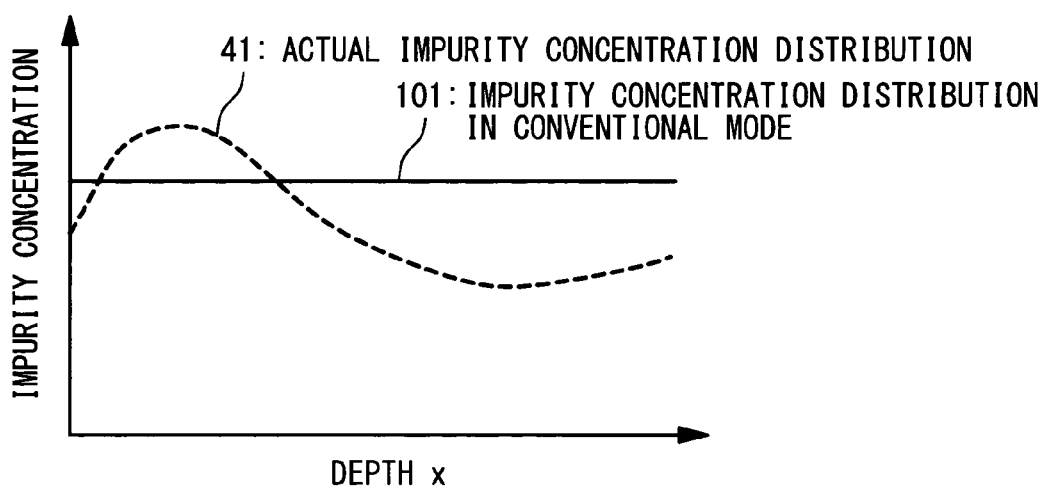
FIG. 2 is a graph showing an example of channel impurity concentration distribution of the MOS transistor in a depth direction.

First, an MOS transistor 30 with a structure as shown in FIG. 1 is assumed. A structure and a manufacturing method of the MOS transistor 30 are specified based on data on the above-mentioned transistor manufacturing condition. At this time, a channel impurity concentration distribution 41 (FIG. 2) at a depth x from an interface between a channel region 34 and a gate oxide film 32 is defined as N(x). Here, based on an input from a user, the concentration distribution setting section 11 selects (assumes) as the distribution N(x), a function which can represent the actual channel impurity concentration distribution 41 of the transistor to be estimated with sufficient accuracy and satisfies the condition that N(x) and N(x)·x can be integrated with respect to x (Step S1). Such function is exemplified by a polynomial in x expressed by the following equation (1). The concentration distribution setting section 11 may automatically select a function which satisfies the above-mentioned condition from a plurality of candidates previously stored in a storage device.

$$N(x) = \sum_{k=0}^{n} a_k x^k \quad (1)$$

Next, the device property calculating section 12 defines a depletion layer width W in the channel region 34 of the MOS transistor 30. The device property calculating section 12 solves the Poisson equation (the following equation (4)) with respect to the depletion layer width W by using a surface potential $\phi_S(W)$ (the below-mentioned Expression (2)) and an effective channel impurity concentration $N_{sub}$ (W) (the following equation (3)) of the MOS transistor 30 to obtain a solution $W_{dep}$ of the depletion layer width W (Step S2).

$$\phi_S(W) = \frac{q}{\varepsilon_{Si}} \int_0^W N(x) \cdot x\, dx + V_b \quad (2)$$

-continued $$N_{sub}(W) = \frac{\left[\int_0^W N(x)\, dx\right]^2}{2 \int_0^W N(x) \cdot x\, ds} \quad (3)$$

$$C_{ox}(V_g - V_{FB} - \phi_S(W)) = \quad (4)$$

$$\sqrt{\frac{2q\varepsilon_{Si}}{\beta}} \, [N_{sub}(W) \cdot (\beta \cdot (\phi_S(W) - V_b) - 1 + \exp(-\beta \cdot (\phi_S(W) - V_b))) +$$

$$\frac{n_i^2}{N_{sub}(0)} \exp(-\beta \cdot V_f) \cdot (\exp(\beta \cdot \phi_S(W)) - \exp(\beta \cdot V_b))]^{\frac{1}{2}}$$

Where q: Elementary electric charge, $\varepsilon_{si}$: Dielectric constant of silicon, $V_b$: Substrate voltage, $C_{ox}$: $\varepsilon_{ox}/T_{ox}$ ($T_{ox}$: Electrical effective oxide film thickness), $V_g$: Gate voltage, $V_{FB}$: Flat band voltage, $\beta$: q/(kBT) (kB: Boltzmann constant, T: Operational temperature (absolute temperature) of transistor), $n_i$: Carrier density of intrinsic semiconductor, and $V_f$: Quasi Fermi level Based on data on the manufacturing condition of the MOS transistor 30, the device property calculating section 12 reads a numerical value indicating each of the above-mentioned symbols at Step S2 by referring to the condition database 21.

Subsequently, the device property calculating section 12 substitutes the obtained solution $W_{dep}$ into the above equation (2) to calculate the surface potential $\phi_S(W_{dep})$ (Step S3). Then, using the calculated surface potential $\phi_S(W_{dep})$, the device property calculating section 12 calculates the transistor characteristics (ex. the gate capacitance $C_{gg}$-gate voltage $V_g$ characteristic and the threshold voltage $V_{th}$-substrate voltage $V_b$ characteristic (or the drain current $I_d$-substrate voltage $V_b$ characteristic)) (Step S4). A method described in the above related arts 1 and 2) can be used as a method of calculating the transistor characteristics from the surface potential $\phi_S(W_{dep})$. Based on the data on the manufacturing condition of the MOS transistor 30, the device property calculating section 12 reads a numerical value of each of the above-mentioned symbols at Steps S3 and S4 by referring to the condition database 21.

Next, the determining section 13 compares the calculated values of the transistor characteristics with measured values of the actual transistor characteristics (Step S5). However, based on the data on the manufacturing condition of the MOS transistor 30, the determining section 13 reads the measured values of the actual transistor electric characteristics at Step S5 by referring to the device property database 22 and uses the value.

Here, when the calculated value and the measured value of the transistor electric characteristic do not coincide with each other (Step S5: No), the process flow returns to Step S1. Based on an input from the user, the concentration distribution setting section 11 adjusts the function selected last time and generates a new function so that the calculated value and the measured value of the electric characteristic may coincide with each other while satisfying the above-mentioned predetermined condition. In the polynomial as shown in the above equation (1), a value of a coefficient $a_k$ (k=0 to n) or an order n is changed. Alternatively, the concentration distribution setting section 11 may uniquely adjust the function selected last time and generate a new function.

The concentration distribution setting section 11 selects (assumes) the newly-generated function for the channel impurity concentration distribution (Step S1). Hereinafter, Steps S2 to S4 are performed in a similar manner. As described above, Steps S1 to S4 are repeated while adjusting the distribution N(x) until the calculated value and the measured value of the transistor characteristic coincide with each other (Step S5: Yes).

When the calculated value and the measured value of the transistor electric characteristic coincide with each other (Step S5: Yes), the determining section 13 sets the distribution N(x) as the actual transistor channel impurity concentration distribution. Then, the determining section 13 associates the channel impurity concentration distribution N(x) with the data on the transistor manufacturing condition of the MOS transistor 3, and stores them in the concentration distribution database 23 (Step S6). It should be noted that in consideration of an error, the condition is set that a difference between both values falls within a predetermined range (for example, ±5%).

According to the method of analyzing the semiconductor device described above, the channel impurity concentration distribution N(x) can be calculated more accurately. Also, according to the above-mentioned method of analyzing the semiconductor device, one channel impurity concentration distribution N(x) is calculated for data on the transistor manufacturing condition of one MOS transistor 30. Such a calculation of the channel impurity concentration distribution N(x) (Steps S1 to S6) is performed for each of various manufacturing methods and structures (including size) which can be expected in a circuit design. Thereby, the concentration distribution database 23 can store the channel impurity concentration distributions N(x) concerning each of various transistors which can be expected in the circuit design.

Figure 5:
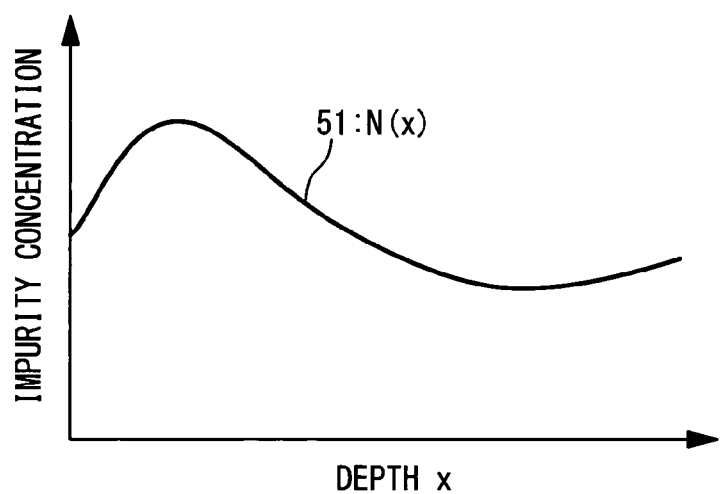
FIG. 5 is a graph showing calculated channel impurity concentration distribution N(x)

FIG. 5 is a graph showing an example of the calculated channel impurity concentration distribution N(x). A vertical axis represents an impurity concentration N(x) and a horizontal axis represents a depth x. In contrast to the constant impurity concentration distribution 101 (solid line) in FIG. 2, the channel impurity concentration distribution N(x) 51 in the present embodiment can represent distribution which is extremely approximate to the actual channel impurity concentration distribution (the impurity concentration distribution 41 (broken line) in FIG. 2). In the example shown in FIG. 5, the distribution $N(x) = a_3 x^3 + a_2 x^2 + a_1 x + a_0$.

Next, a method of designing the semiconductor device (including calculation of the transistor electric characteristics and circuit design) will be described.

Figure 6:
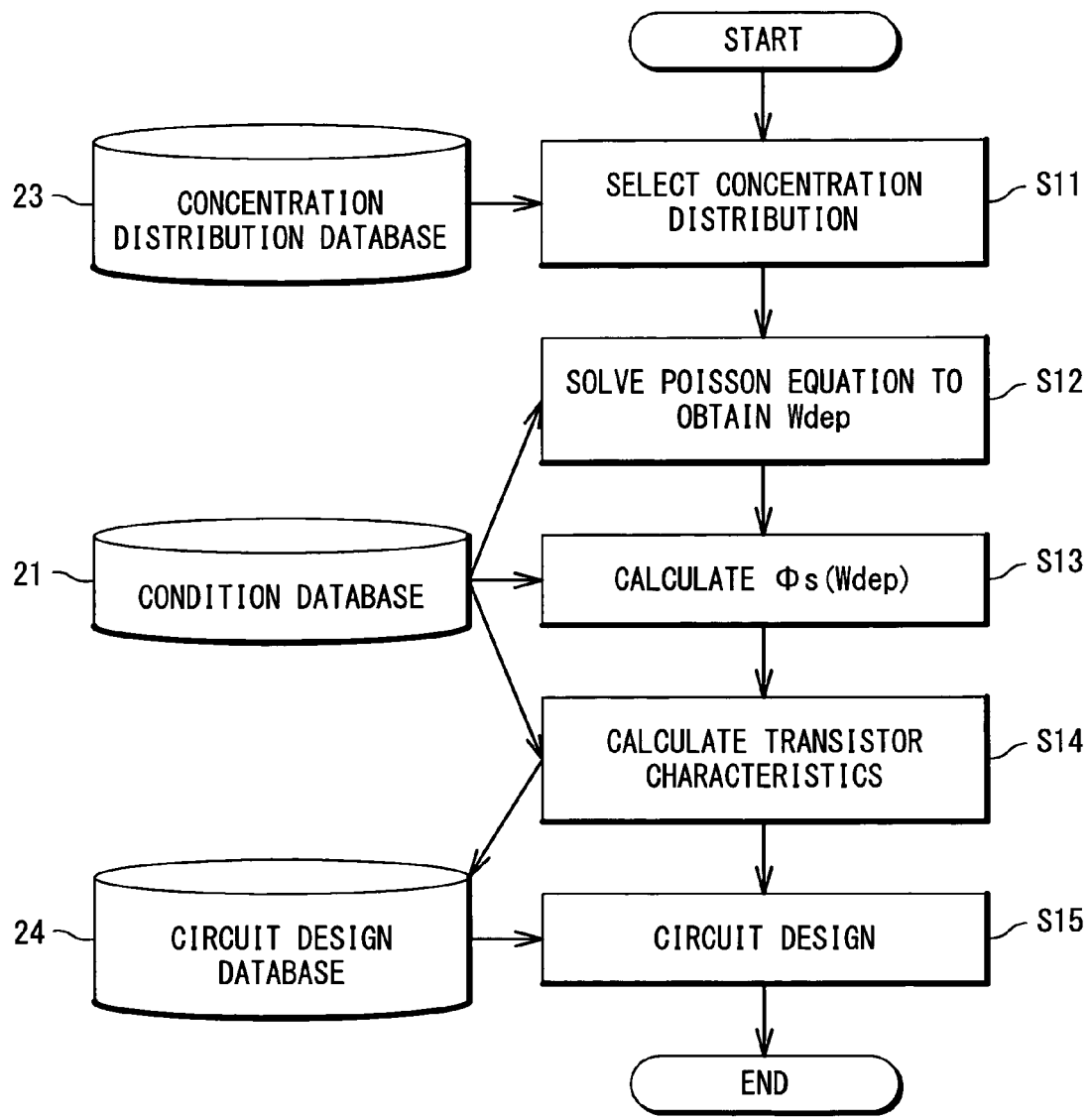
FIG. 6 is a flow chart showing an operation of the information processing apparatus according to the embodiment of the present invention.

FIG. 6 is a flow chart showing an operation of the data processing apparatus according to an embodiment of the present invention. The operation of the data processing apparatus 1 functions as the method of designing the semiconductor device.

First, based on the externally inputted manufacturing method and structure (including size) of a target MOS transistor, the device property calculating section 12 extracts an appropriate channel impurity concentration distribution N(x) by referring to the concentration distribution database 23 (Step S11). The external input is exemplified by an input from the user or extraction from data on design. Next, the device property calculating section 12 defines a depletion layer width W in the channel region 34 by using the channel impurity concentration distribution N(x) and solves the Poisson equation (the above equation (4)) with respect to the depletion layer width W by using the surface potential $\phi s(W)$ (the above equation (2)) and the effective channel impurity concentration $N_{sub}(W)$ (the above equation (3)) to obtain the solution $W_{dep}$ of the depletion layer width W (Step S12). Based on the data on the manufacturing condition of the MOS transistor, the device property calculating section 12 reads a numerical value of each of the above-mentioned symbols at Step S12 by referring to the condition database 21 and uses the value.

Subsequently, the device property calculating section 12 substitutes the obtained solution $W_{dep}$ into the above equation (2) to calculate the surface potential $\phi s(W_{dep})$ (Step S13). Then, the transistor electric characteristics (e.g., the gate capacitance $C_{gg}$-gate voltage $V_g$ characteristic and the threshold voltage $V_{th}$-substrate voltage $V_b$ characteristic (or the drain current $I_d$-substrate voltage $V_b$ characteristic)) are calculated by using the calculated surface potential $\phi s(W_{dep})$ (Step S14). Methods of calculating the transistor electric characteristics from the surface potential $\phi s(W_{dep})$ described in the above related arts 1 and 2) can be used. Based on the data on the manufacturing condition of the MOS transistor 30, the device property calculating section 12 reads a numerical value of each of the above-mentioned symbols at Steps S13 and S14 by referring to the condition database 21 and uses the values. The device property calculating section 12 associates data on the obtained transistor electric characteristics with data on the transistor manufacturing condition (including size), and stores the data as a part of a library containing a basic logic gate, a basic circuit block and a cell in the circuit design database 24.

Next, based on the manufacturing method and structure (including size) of the target transistor, the circuit designing section 14 reads an appropriate transistor electric characteristic and other data necessary for a circuit design by referring to the design database 24, and performs design of a circuit using the transistor (Step S15). The circuit design is exemplified by a logic design such as an architecture design, a logic circuit design and a transistor circuit design (basic circuit design) and a layout design such as floor planning/arrangement and wiring and layout certification.

According to the above-mentioned method of analyzing the semiconductor device and method of designing the semiconductor device, more accurate surface potential $\phi s(W)$ can be calculated by using the channel impurity concentration distribution N(x) calculated more accurately and more accurate transistor electric characteristic can be calculated by using them. In addition, the semiconductor circuit can be designed with a reduced error by using the calculated more accurate electric characteristic.

Also, according to the present invention, in the MOS transistor, the channel impurity concentration distribution can be calculated more accurately. Since a surface potential can be calculated accurately according to the more accurately calculated channel impurity concentration distribution, the transistor electric characteristics calculated by using the surface potential can be reproduced with high accuracy. As a result, the semiconductor circuit can be designed with reduced error.

The program and the data structure according to the present invention may be recorded in a computer-readable storage medium and read from the storage medium into the data processing apparatus 1.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:
1. A support apparatus for analysis and design of a semiconductor device, comprising:
 a storage section configured to store a set of a structure data indicating a structure of a transistor device and a measurement value of each of electric characteristics of said transistor;

a concentration distribution setting section configured to set a function indicating an impurity concentration distribution in a channel region of a first transistor in a depth direction;

a device property calculating section configured to express a Poisson's equation by using the function, to solve the expressed Poisson's equation by using a depletion layer width as a variable to calculate a surface potential, and to determine a first calculation value of the electric characteristic of the first transistor by using the surface potential; and a determining section configured to refer to said storage section based on a first structure data indicating a structure of the first transistor to read out a measurement value corresponding to the first structure data, to determine the function to indicate the impurity concentration distribution of the first transistor when the measurement value and the first calculation value are substantially coincident with each other, and to store the function in said storage section in relation to the structure data, wherein said concentration distribution setting section and said device property calculating section perform their operations until the first calculation value and the measurement value are substantially coincident with each other, wherein said device property calculating section refers to said storage section based on a second structure data indicating a structure of a second transistor to read out the function corresponding to the second structure data, expresses the Poisson's equation by using the read function, solves the expressed Poisson's equation by using a depletion layer width as a variable to calculate a surface potential, and to determine a second calculation value of the electric characteristic of the second transistor by using the surface potential, and said support apparatus further comprises:

a circuit designing section configured to design a circuit using the second transistor based on the second calculation value.

2. The support apparatus according to claim 1, wherein when the depth is expressed by x, and the function is expressed by N(x), the function expresses the impurity concentration distribution in a channel region of an actual transistor and a product of the function N(x) and the depth x and the function N(x) are analytically integratable with respect to the depth x.

3. The support apparatus according to claim 2, wherein the function N(x) is a polynomial in x.

4. A method of analyzing and designing a semiconductor device, comprising:

setting, by a computer, a function indicating an impurity concentration distribution in a channel region of a first transistor in a depth direction;

determining, by a computer, a surface potential by solving a Poisson's equation, which is expressed using the function, with respect to a depletion layer width as a variable;

calculating, by a computer, a first calculation value of an electric characteristic of the first transistor;

reading out, by a computer, a measurement value corresponding to a first structure data indicating a structure of the first transistor from a storage section which stores a set of a structure data indicating a structure of a transistor and a measurement value of an electric characteristic of the transistor;

determining, by a computer, the function to indicate the impurity concentration distribution of the first transistor when the measurement value and the first calculation value are coincident with each other;

storing, by a computer, the function in said storage section in relation to the structure data;

repeating, by a computer, said setting, said determining a surface potential and said calculating a first calculation value until the measurement value and the first calculation value are coincident with each other;

reading out the function corresponding to a second structure data from said storage section based on the second structure data indicating a structure of a second transistor;

determining a surface potential by solving the Poisson's equation, which is expressed using the function: with respect to a depletion layer width as a variable;

calculating a second calculation value of the electric characteristic of the second transistor by using the surface potential; and designing a circuit using the second transistor based on the second calculation value.

5. The method according to claim 4, wherein when the depth is expressed by x, and the function is expressed by N(x), the function expresses the impurity concentration distribution in a channel region of an actual transistor and a product of the function N(x) and the depth x and the function N(x) are analytically integratable with respect to the depth x.

6. The method according to claim 5, wherein the function N(x) is a polynomial in x.

7. A computer-readable storage medium in which a computer-readable program code is stored, the computer-readable program code, when executed by a computer, causing the computer to perform a method of analyzing and designing a semiconductor device, wherein the method comprises:

setting a function indicating an impurity concentration distribution in a channel region of a first transistor in a depth direction;

determining a surface potential by solving a Poisson's equation, which is expressed using the function, with respect to a depletion layer width as a variable;

calculating a first calculation value of an electric characteristic of the first transistor;

reading out a measurement value corresponding to a first structure data indicating a structure of the first transistor from a storage section which stores a set of a structure data indicating a structure of a transistor and a measurement value of an electric characteristic of the transistor;

determining the function to indicate the impurity concentration distribution of the first transistor when the measurement value and the first calculation value are coincident with each other;

storing the function in said storage section in relation to the structure data;

repeating said setting, said determining a surface potential and said calculating a first calculation value until the measurement value and the first calculation value are coincident with each other;

reading out the function corresponding to a second structure data from said storage section based on the second structure data indicating a structure of a second transistor;

determining a surface potential by solving the Poisson's equation, which is expressed using the function, with respect to a depletion layer width as a variable;

calculating a second calculation value of the electric characteristic of the second transistor by using the surface potential; and designing a circuit using the second transistor based on the second calculation value.

8. The computer-readable storage medium according to claim 7, wherein when the depth is expressed by x, and the function is expressed by $N(x)$, the function expresses the impurity concentration distribution in a channel region of an actual transistor and a product of the function $N(x)$ and the depth x and the function $N(x)$ are analytically integratable with respect to the depth x.

9. The computer-readable storage medium according to claim 8, wherein the function $N(x)$ is a polynomial in x.

* * * * *